United States Patent [19]

Takemae

[11] Patent Number: 4,688,219
[45] Date of Patent: Aug. 18, 1987

[54] SEMICONDUCTOR MEMORY DEVICE HAVING REDUNDANT MEMORY AND PARITY CAPABILITIES

[75] Inventor: Yoshihiro Takemae, Tokyo, Japan

[73] Assignee: Fujitsu Limited, Kawasaki, Japan

[21] Appl. No.: 765,817

[22] Filed: Aug. 15, 1985

[30] Foreign Application Priority Data

Aug. 17, 1984 [JP] Japan ............................... 59-171317

[51] Int. Cl.⁴ ..................... G06F 11/00; H03M 13/00; G11C 7/00; G11C 29/00
[52] U.S. Cl. ................................. 371/10; 371/50; 365/200; 365/201
[58] Field of Search ................ 365/200, 201; 364/200; 371/8, 10, 11, 21, 13, 50

[56] References Cited

U.S. PATENT DOCUMENTS

| 4,433,388 | 2/1984 | Oosterbaan | 365/200 |
| 4,463,450 | 7/1984 | Haeusle | 371/10 |
| 4,538,245 | 8/1985 | Smarandoin et al. | 365/200 |
| 4,577,294 | 3/1986 | Brown et al. | 371/10 |
| 4,639,917 | 1/1987 | Furuta | 371/10 |

OTHER PUBLICATIONS

Junzo Yamada 1984 IEEE, ISSCC Digest of Technical Paper pp. 104-105.

Primary Examiner—Terrell W. Fears
Assistant Examiner—Melissa J. Koval
Attorney, Agent, or Firm—Staas & Halsey

[57] ABSTRACT

A semiconductor memory device which has an error correcting circuit and employs a virtual two-dimensional matrix for correcting read data is provided. The device includes a redundant memory cell to replace a defective memory cell. When the selected memory cell has a previously determined hard error, the selected memory cell is replaced by the redundant memory cell. When the selected memory cell has a soft error or a hard error occuring after the determination of the previously determined hard error, the read data is corrected by the error correcting circuit.

14 Claims, 7 Drawing Figures

Fig. 2

| | VPC₁ | VPC₂ | | VPC_i | | VPC_k |
|---|---|---|---|---|---|---|
| HPC₁ | MC₁ (1,1) | MC₂ (2,1) | --- | MC_i (i,1) | --- | MC_k (k,1) |
| HPC₂ | MC_{k+1} (1,2) | MC_{k+2} (2,2) | --- | MC_{k+i} (i,2) | --- | MC_{2k} (k,2) |
| | --- | --- | | --- | | --- |
| HPC_j | MC_{(j-1)k+1} (1,j) | MC_{(j-1)k+2} (2,j) | --- | MC_{(j-1)k+i} (i,j) | --- | MC_j (k,j) |
| | --- | --- | | --- | | --- |
| HPC_m | MC_{(m-1)k+1} (1,m) | MC_{(m-1)k+2} (2,m) | --- | MC_{(m-1)k+i} (i,m) | --- | MC_{mk} (k,m) |

SEL(k) VSG

HSG (m)

SEMICONDUCTOR MEMORY DEVICE HAVING REDUNDANT MEMORY AND PARITY CAPABILITIES

BACKGROUND OF THE INVENTION

1. Field of the Invention

The present invention relates to a semiconductor memory device having an error correction function. The device can process both a soft error and a hard error by adding an error correction code (ECC) and redundant bits.

2. Description of the Related Art

A redundant technique is widely known which improves the yield of semiconductor memory devices. In the redundant technique, a redundant memory cell array storing correct data is added to a regular memory cell array. When a defective memory cell is selected to be read, the redundant memory cell is actually read in place of the defective memory cell, so that the correct data can be read. However, this redundant technique can be applied only to previously determined defective memory cells. That is, once defective memory cells are determined, other defective read data caused by hard errors or soft errors after the determination of the defective memory cells can not be corrected.

An increase in the capacity of a dynamic-type memory device easily causes the occurrence of soft errors by α rays. Whether the data read from the memory is correct or incorrect can be determined by means of parity checking. However, although the presence of an error bit may be determined by parity checking, the position (address) of the error bit cannot be determined, and accordingly, error correction cannot be performed. To determine the error bit and to make it correctable, an improved parity checking technique employing a parity-checking two-dimensional virtual matrix has conventionally been incorporated into a conventional semiconductor memory device (see, for example, Japanese Unexamined Patent Publication No. 57-152597, Inventor: Junzo Yamada et al, Applicant: NTT, Filing date: Mar. 17, 1981). This conventional semiconductor memory device employing the parity-checking two-dimensional virtual matrix, however, can correct only a single bit error, as later described in more detail. Further, since the redundant technique is not employed, it provides a low yield.

The above-mentioned redundant technique can be combined with the improved parity checking technique so as to be able not only to correct the previously determined hard errors but also to correct soft errors or hard errors caused after the determination of the previously determined hard errors. However, since the parity-checking two-dimensional virtual matrix has a predetermined logic for outputting data in response to a selected memory cell, it is impossible to simply replace a defective column with the redundant column. Therefore, unless a great number of circuit elements are used for preventing the previously determined hard errors from entering the two-dimensional virtual matrix, it is difficult to combine the redundant technique with the improved parity-checking technique.

SUMMARY OF THE INVENTION

An object of the present invention is to provide a semiconductor memory device in which the redundant technique and the two-dimensional parity-checking technique are combined, whereby not only previously determined hard errors along a predetermined bit (column) line but also other soft and hard errors occuring after the occurrence of previously determined hard errors can be corrected.

Another object of the present invention is to provide the above semiconductor memory device, whereby the yield of the device is improved.

Still another object of the present invention is, to provide the above semiconductor memory device by adding a relatively simple circuit.

To attain the above objects, there is provided, according to the present invention, a semiconductor memory device comprising a memory cell array including a plurality of memory cells arranged in a matrix, an error correcting circuit, and a redundant memory cell to replace a defective memory cell. In addition, an inhibit and parity generating circuit is provided.

The error correcting circuit includes a data selector, operatively connected to the memory cell array, for receiving read data from a plurality of memory cells including a selected memory cell. The data selection also selectively outputs a part of the read data which forms horizontal and vertical parity-checking groups corresponding to a parity-checking two-demensional virtual matrix. A vertical parity generator and a horizontal parity generator are connected to the data selector, for generating a vertical parity and a horizontal parity of the data group, respectively. In addition, a parity storing memory for storing a previously determined vertical parity and a previously determined horizontal parity are included along with a comparator connected to the vertical and horizontal parity generators and to the parity storing memory. The comparator compares the outputs of the inhibit and parity generating circuit with the previously determined vertical and horizontal parities so as to correct an error in the read data.

The inhibit and parity generating circuit includes an inhibit circuit connected between the data selector. The inhibit and parity generating circuit selectively inhibits data, including an error data read, from a defective memory cell from entering the vertical or horizontal parity generator when the data group, from which the vertical parity and the horizontal parity are to be taken, includes error data. A redundant-cell parity generating circuit (IC$_2$, IC$_3$, G$_2$, G$_3$) is connected to the redundant memory cell and to the vertical and horizontal parity generators, for generating a redundant vertical parity or a redundant horizontal parity, based on the remaining data, (except for the inhibited data in the data group) and on the data from the redundant memory cell, when the inhibit circuit carries out an inhibit operation.

BRIEF DESCRIPTION OF THE DRAWINGS

The above objects and features of the present invention will be more apparent from the following description of the preferred embodiments with reference to the accompanying drawings, wherein:

FIG. 2 is a table of the contents of a parity-checking two-dimensional virtual matrix in a data selector in the device shown in FIG. 1;

DESCRIPTION OF THE PREFERRED EMBODIMENTS

Figure 1:
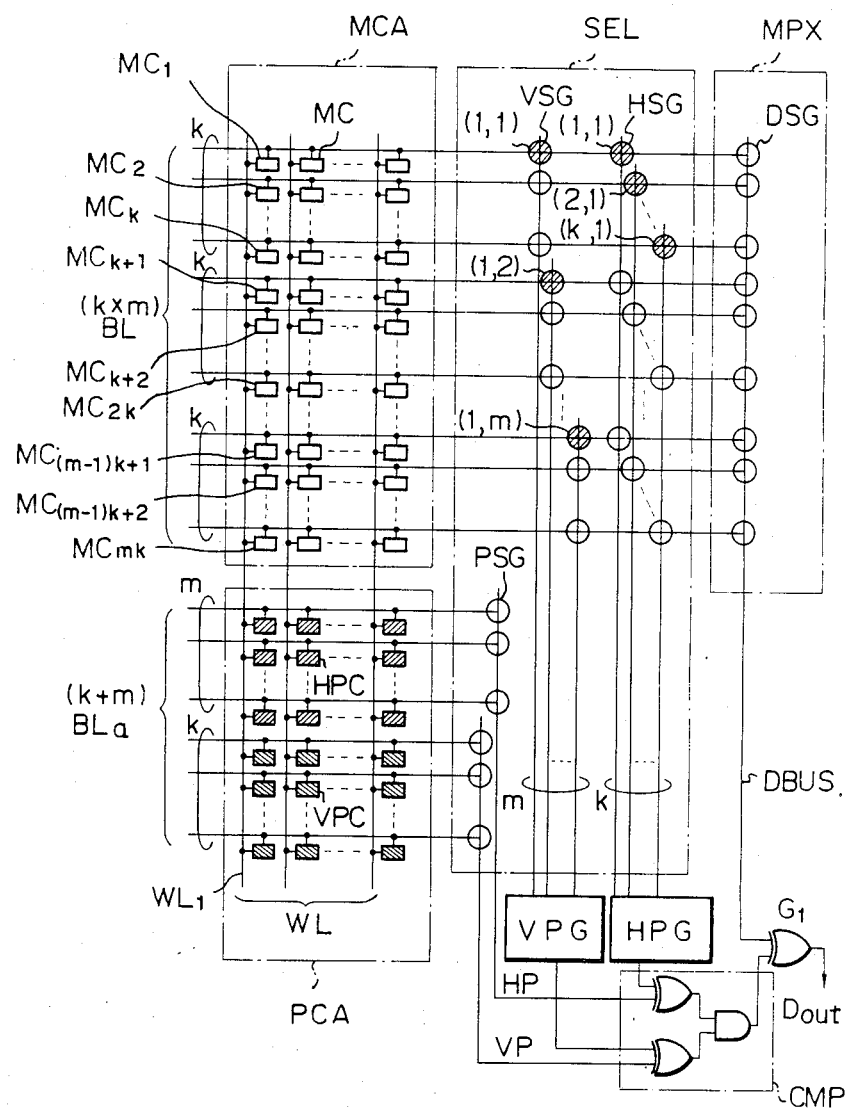
FIG. 1 is a circuit diagram of a conventional semiconductor memory device having a conventional error correction function.

Before describing the embodiments of the present invention, a conventional semiconductor memory device employing a parity-checking two-dimensional virtual matrix is described with reference to FIG. 1. In the figure, MCA is a memory cell array in which a number of dynamic-type memory cells MC are arranged in a matrix fashion, wherein a number of $k \times m$ bit lines BL (where k and m are integers) are provided in the horizontal (column) direction and a plurality of word lines WL are provided in the vertical (row) direction. Simultaneously with a selection of one word line WL, data is read out from the memory cells MC of $(k \times m)$ bits connected to the selected word line WL. In a multiplexer MPX, only one bit thereof is selected in accordance with a selected bit line. $DGS_s$ are data selecting gates for effecting the selection of one bit, which is controlled by an output of a column decoder (not shown). DBUS is a data bus for transferring the data of the selected memory cell to an output EOR gate $G_1$.

Simultaneously with the above-mentioned read-out operation, a selector SEL virtually (or logically) rearranges the data of all memory cells having $(k \times m)$ bits connected to the selected word line in a parity-checking two-dimensional matrix (hereinafter referred to as an H-V matrix) with m bits in the vertical direction and k bits in the horizontal direction. The contents of the H-V matrix are shown in FIG. 2. In the data selector SEL, VSG is a vertical select gate for selecting m-bit data on a selected vertical row of the H-V matrix, and HSG is a horizontal select gate for selecting k-bit data on a selected horizontal column of the H-V matrix. Assume that a memory cell $MC_{(j-1)k+i}$ connected to the left-most word line $WL_1$ is selected. Then, the vertical select gate VSG selects, by a decoder (not shown), m number of memory cells $MC_i$, $MC_{k+i}$, ..., $MC_{(j-1)k+i}$, ..., and $MC_{(m-1)k+i}$ virtually arranged on the i-th row of the H-V matrix shown in FIG. 2; and the horizontal select gate HSG selects, by decoder (not shown), k number of memory cells $Mc_{(j-1)k+1}$, $MC_{(j-1)k+2}$, ..., $MC_{(j-1)k+i}$, ..., and $MC_j$ virtually arranged on the j-th column of the H-V matrix shown in FIG. 2. Examples of the memory cells selected by the vertical select gate VSG and the horizontal select gate HSG, when i=1 and j=1, for example, are illustrated by slashed lines in FIG. 1. The selected m bits from the vertical select gate VSG are input to a vertical parity generator VPG, and the selected k bits from the horizontal select gate HSG are input to a horizontal parity generator HPG. The vertical parity generator VPG generates a vertical parity for the m bits, and the horizontal parity generator HPG generates a horizontal parity for the k bits.

PCA is a parity cell array including parity cells each storing a correct vertical parity or a correct horizontal parity. The correct parities have been previously written into the parity cells during the writing of data into all of the memory cells MC in the memory cell array MCA. During construction of the parity cell array PCA, there are m bits of horizontal parity cells HPC and k bits of vertical parity cells VPC connected to each word line WL. $BL_a$ represents $(k+m)$ bit lines related to the cells HPC and VPC. When the memory cell, for example, $MC_{(j-1)k+i}$ is selected, a j-th bit line in the m bit lines $BL_a$ is selected; and an i-th bit line in the k bit lines $BL_a$ is selected so that a horizontal parity cell $HPC_j$ and a vertical parity cell $VPC_i$ is selected (see FIG. 2). This selection of the parity cells is carried out by parity select gates $PSG_s$ in the data selector SEL.

A comparator CMP compares the vertical parity output from the vertical parity generator VPG with the correct vertical parity output from the vertical parity cell $VPC_i$. The comparator also compares the horizontal parity output from the horizontal parity generator HPG with the correct horizontal parity output from the horizontal parity cell $HPC_j$. The comparator outputs "0" when these coincide and outputs "1" when they do not coincide. The output "1" of the comparator CMP is generated in the H-V matrix shown in FIG. 2 when both the vertical parity comparison and the horizontal parity comparison simultaneously represent the noncoincidence of the vertical parity of the read data with the correct vertical parity, and the non-coincidence of the horizontal parity of the read data with the correct horizontal parity. This means that the data read from the memory cell $MC_{(j-1)k+i}$ at the intersection of the selected vertical row and the selected horizontal column in the H-V matrix is not correct. Accordingly, when the output "1" is input to the EOR gate $G_1$ having another input connected to the data bus DBUS, the read data at that time, that is, the read data generating an error, is inverted. Thus, corrected data $D_{out}$ can be obtained.

The error correction function by means of the above-described H-V matrix is effective not only for a soft error due to α rays but also for a hard error caused by a hard defect of a memory cell or for a bit line defect. However, there is a disadvantage in the above-described H-V matrix. The disadvantage is that the correctable error is only one bit in the memory cells belonging to a common horizontal or vertical parity group. Therefore, an error can be corrected only when a single bit in any H-V parity check data group in the above-mentioned H-V matrix is incorrect.

To correct a plurality of hard errors, a redundancy technique for improving the yield, is known. In a redundant construction in which a row redundancy, i.e., a redundant word line, is provided to replace a defective word line, the conventional technique can be combined with the redundant technique without any difficulty. Hard defects along a predetermined defective word line can be remedied by the redundance technique, and a soft error or a hard error caused after the determination of the defective word line can be realized by means of the two-dimensional parity checking using the above-mentioned H-V matrix. However, it is difficult to combine the construction of a column (bit line) redundancy with the above-described two-dimensional parity-checking technique. When only the conventional column redundant technique is used, the switching from the defective column to the redundant column could be done merely by controlling the switching of the coupling to the data bus lines from the regular column (defective column) to the redundant column. However, to simply combine two-dimensional parity-checking with column redundancy, the logic of switching from the regular column (the memory cells connected to the selected bit line), which must be expressed in a number of H-V matrices, to the redundant column, becomes too complex. That is, to effect switching to the redundant column and to also effect two-dimensional parity checking using the H-V matrix, a defective-column data must be inhibited from mixing with a column-data group from which a parity is to be taken. The defective column data must also be replaced by the redundant column data. Since the location of the generation of the defective column is indefinite, the correspondence between the redundant column and the H-V matrix is difficult to establish without assembling a switching control circuit. The switching control circuit would require a great number of circuit elements to realize this very complex logic.

According to the present invention, however, the combination of two-dimensional parity-checking with column redundancy can be realized by employing a relatively simple circuit.

The embodiments of the present invention will now be described.

Figure 3:
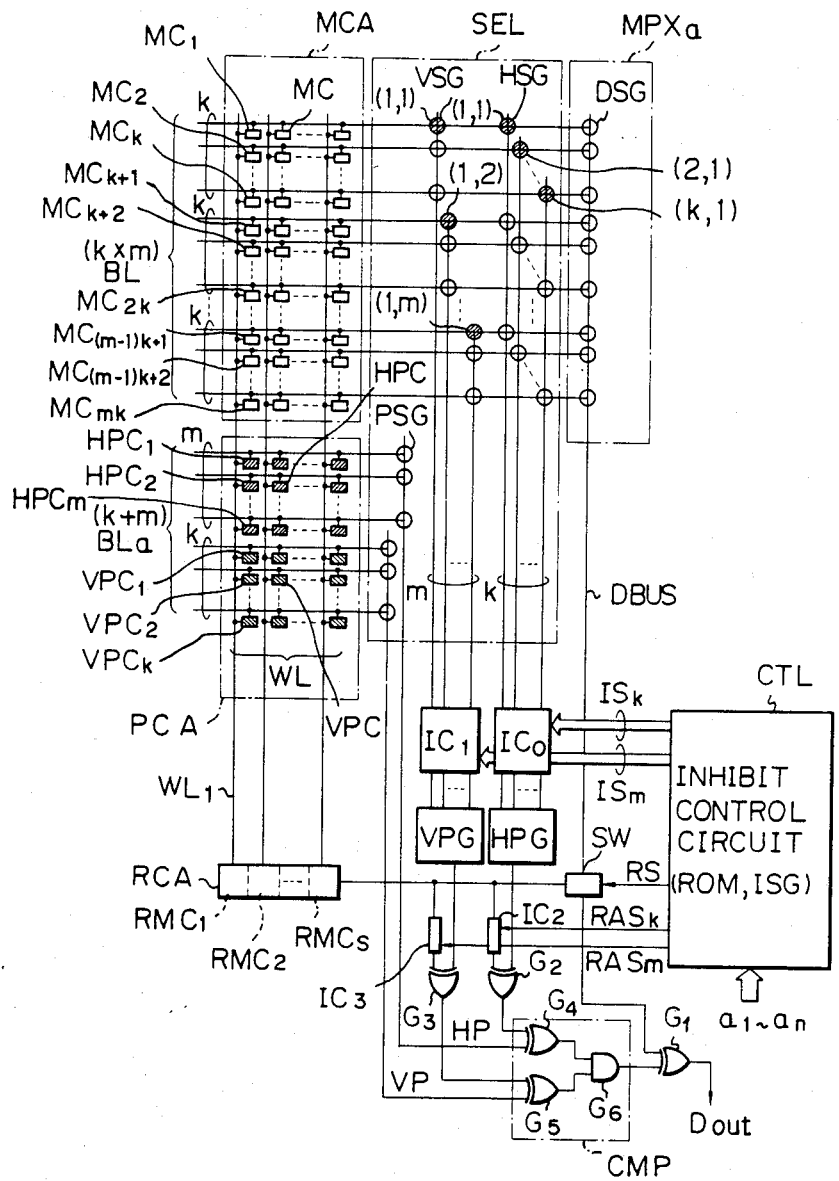
FIG. 3 is a circuit diagram of a semiconductor memory device according to an embodiment of the present invention.

FIG. 3 is a circuit diagram of an embodiment of the present invention in which the same portions as those in FIG. 1 are provided with the same symbols. In FIG. 3, in addition to the memory cell array MCA, the data selector SEL, the multiplexer MPX, the parity cell array PCA, the vertical parity generator VPG, the horizontal parity generator HPG, the comparator CMP, and the EOR gate $G_1$, which are included in the conventional device shown in FIG. 1, the semiconductor memory device of the embodiment shown in FIG. 3 further includes a redundant cell array RCA (redundant column) having an output connected to inputs of inhibit circuits $IC_2$ and $IC_3$. The outputs of the inhibit circuits $IC_2$ and $IC_3$ and the outputs of the horizontal and vertical parity generators HPG and VPG are respectively input to EOR gates $G_2$ and $G_3$. Inhibit circuits $IC_0$ and $IC_1$ are inserted between the data selector SEL and the horizontal and vertical parity generators HPG and VPG. A switching circuit SW, for switching between the output of the redundant cell array RCA and the data bus DBUS, is connected between the data bus DBUS and an input of the EOR gate $G_1$. The inhibit circuits $IC_0$ through $IC_3$ and the switching circuit SW are controlled by an inhibit control circuit CTL. In the redundant cell array RCA, the same number s of redundant memory cells $RMC_1$, $RMC_2$, . . . , and $RMC_s$ as that of the memory cells connected to each regular bit line in the memory cell array MCA are arranged. Each redundant memory cell is selected by a word line WL common to the memory cell array MCA. EOR gates $G_4$ and $G_5$ and AND gate $G_6$ form the comparator CMP, which is the same as that shown in FIG. 1. The outputs of the EOR gates $G_2$ and $G_3$ are connected to one of the inputs of the EOR gates $G_4$ and $G_5$, respectively. The other inputs of these EOR gates $G_4$ and $G_5$, respectively, receive a horizontal parity HP and a vertical parity VP from the parity cell array PCA.

Figure 4:
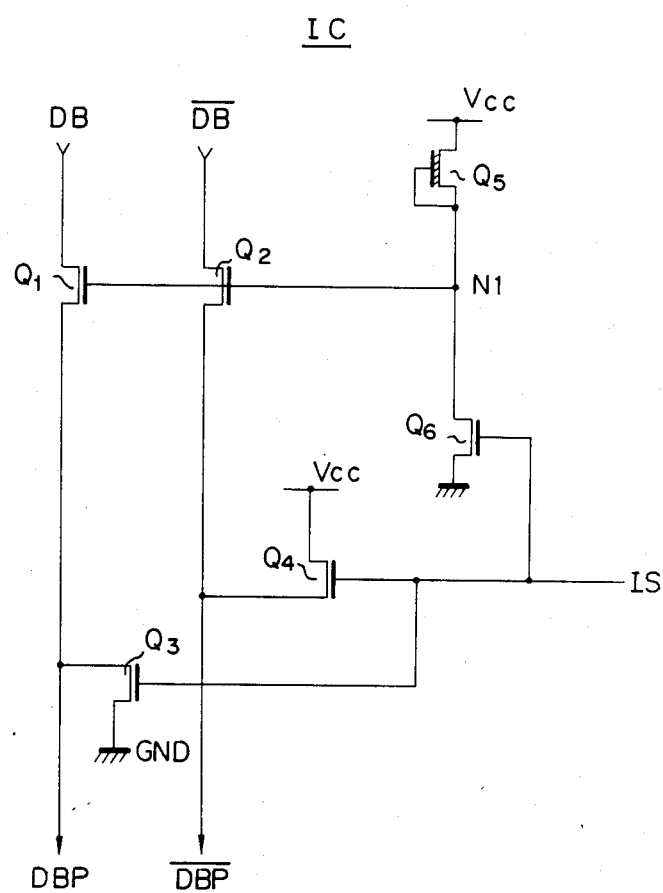
FIG. 4 is a circuit diagram of a of an inhibit circuit in the device shown in FIG. 3.

FIG. 4 is an example of a basic circuit for forming the inhibit circuits $IC_0$ through $IC_3$. The inhibit circuits $IC_2$ and $IC_3$ are respectively formed by one basic circuit. The inhibit circuit $IC_0$ is formed by k circuits. The inhibit circuit $IC_1$ is formed by m basic circuits. DB represents an input of the basic circuit, and DBP represents an output of the basic circuit. In practice, since each of the outputs of the data selector SEL are complementary, an inverted input $\overline{DB}$ and inverted output $\overline{DBP}$ are also provided. $V_{cc}$ is a power supply voltage for providing a high (H) level. GND is the ground potential for providing a low (L) level. MOS transistors $Q_1$ and $Q_2$ are for inhibiting the signals at inputs DB and $\overline{DB}$. When the transistors $Q_1$ and $Q_2$ are ON, the signals at inputs DB and $\overline{DB}$ are permitted to pass through to the outputs DBP and $\overline{DBP}$. When the transistors $Q_1$ and $Q_2$ are OFF, the signals at the inputs DB and $\overline{DB}$ are inhibited and cannot pass through to the outputs DBP and $\overline{DBP}$. The control of the transistors $Q_1$ and $Q_2$ is effected by the output $N_1$ of a MOS inverter consisting of transistors $Q_5$ and $Q_6$. The transistor $Q_5$ is a depletion-type MOS transistor. That is, when an inhibit signal IS, given by the inhibit control circuit CTL, is at the high (H) level, the output $N_1$ of the inverter becomes a low (L) level so that the transistors $Q_1$ and $Q_2$ are OFF, thus preventing the levels of the signals at the inputs DB and $\overline{DB}$ from passing through $Q_1$ and $Q_2$ to reach the outputs DBP and $\overline{DBP}$. Instead, the transistors $Q_3$ and $Q_4$ are turned ON so that the signal at the output DBP is fixed at the low (L) level and the signal at the output $\overline{DBP}$ is fixed at the high (H) level.

In the following description, assume that the memory cell $MC_{(j-1)k+i}$ at the intersection between a word line $WL_1$ and a bit line $BL_{(j-1)k+i}$ (that is, located at the coordinate (i, j) of the H-V matrix (see FIG. 2)), is a previously determined defective memory cell. In other words, the bit line, to which the memory cell $MC_{(j-1)k+i}$ is connected is the previously determined bit line.

The reading operation of the semiconductor memory device shown in FIG. 3 is described with reference to FIGS. 2, 3, and 4.

When the defective memory cell $MC_{(j-1)k+i}$ is selected to be read, the inhibit circuit $IC_0$ receives the error data from the i-th line in the k lines connected to the output of the horizontal select gate HSG. The inhibit circuit $IC_1$ receives the error data from the j-th line in the m lines connected to the output of the vertical select gate VSG. In the inhibit circuit $IC_0$, the error data is received by the i-th basic circuit in the k basic circuits. In the inhibit circuit $IC_1$, the error data is received by the j-th basic circuit in the m basic circuits. The i-th inhibit signal IS in the k bits of inhibit signal data $IS_k$ generated by the inhibit control circuit CTL is at the H level in accordance with the external address $a_1$ through $a_n$ for specifying the defective bit line. Therefore, the inbit circuit $IC_0$ inhibits the error data from passing through to the i-th output in the k-bit output thereof; and the inhibit circuit $IC_1$ inhibits the error data from passing through to the j-th output in the m-bit output thereof. In other words, the j-th output of the inhibit circuit $IC_0$ and the k-th output of the inhibit circuit $IC_1$ are both fixed at the L level, i.e., at "0". Therefore, the horizontal parity generator HPG and the vertical parity generator VPG, respectively, generate horizontal and vertical parities of the read data, without taking the inhibited error data into account.

On the other hand, the inhibit control circuit CTL generates redundant-cell inhibit signals $RAS_k$ and $RAS_m$ of the H level in accordance with the external address for specifying the defective bit line. In response to the redundant-cell inhibit signals $RAS_k$ and $RAS_m$, the inhibit circuits $IC_2$ and $IC_3$ provide the correct data stored in the redundant memory cell array RCA. The correct data in the redundant memory cell $RMC_1$ is selected in response to the selected word line $WL_1$. The EOR gate $G_2$ generates a horizontal parity of the correct read data, and the EOR gate $G_3$ generates a vertical parity of the correct read data. In the comparator CMP, the EOR gate $G_4$ compares the horizontal parity of the correct data with the correct horizontal parity transferred from the parity cell array PCA through the parity select gate PSG, and the EOR gate $G_5$ compares the vertical parity of the correct data with the vertical parity transferred from the partity cell array PCA.

Unless the parity of the remaining data group obtained at the output of the horizontal parity generator HPG or the vertical parity generator VPG represents an error, the output of the comparator becomes "0". The switching circuit SW selects the correct data from the redundant cell array RCA in response to a redundant switching signal RS having a "0" level applied from the inhibit control circuit CTL. Thus, the correct data is read out at the output $D_{out}$. In conclusion, for the previously determined hard errors, the redundant technique is effectively used to read correct data in the semiconductor memory device shown in FIG. 3.

When a memory cell other than the defective memory cell $MC_{(j-1)k+i}$ is selected to be read, the reading operation is as follows. Assume that the selected memory cell is $MC_{(j-1)k+i+p}$ located at the coordinate (i+p, j) of the H-V matrix. Referring to FIG. 2, the memory cell $MC_{(j-1)k+i+p}$ is arranged on the same horizontal column of the H-V matrix as the defective memory cell $MC_{(j-1)k+i}$, while the vertical row (i+p) on which the selected memory cell is arranged is different from the vertical row i of the defective memory cell $MC_{(j-1)k+i}$. If a soft error or a hard error occurs on the selected memory cell $MC_{(j-1)k+i+p}$ after the determination of the defective bit line, the horizontal parity generator HPG and the vertical parity generator VPG receive the error data from the inhibit circuits $IC_0$ and $IC_1$. If the inhibit circuit $IC_0$ is not provided as in the conventional device shown in FIG. 1, the error data of the defective memory cell $MC_{(j-1)k+i}$ also is transferred through the i-th line of the k lines from the horizontal select gate HSG, so that the horizontal select gate HSG receives two error bits, causing parity checking to becomes impossible.

However, since the inhibit circuits $IC_0$ and $IC_1$ are provided in this embodiment, the i-th inhibit signal IS in the k bits of the inhibit signal data $IS_k$ generated by the inhibit control circuit CTL is at the H level because the selected memory cell $MC_{(j-1)k+i+p}$ and the defective memory cell $MC_{(j-1)k+i}$ are both arranged on the same j-th horizontal column in the H-V matrix. Therefore, the inhibit circuit $IC_0$ inhibits the error data of the defective memory cell $MC_{(j-1)k+i}$ from passing therethrough.

Note, since the vertical row (i+p) to which the selected memory cell $MC_{(j-1)k+i+p}$ belongs is different from the vertical row (i) of the defective memory cell $MC_{(j-1)k+i}$, the inhibit circuit $IC_1$ does not effect the inhibit operation.

The redundant-cell inhibit signal $RAS_k$ is set to "1" in accordance with the external address $a_1$ through $a_n$, particularly with a part of the external address for specifying the j-th column in the H-V matrix, so that the inhibit circuit $IC_2$ passes the correct data from the redundant memory cell $RMC_1$ to the EOR gate $G_2$. The redundant-cell inhibit signal $RAS_m$ is set to "0" in accordance with another part of the external address for specifying the (i+p)-th row in the H-V matrix, so that the output of the inhibit circuit $IC_3$ is fixed to "0".

Thus, the EOR gate $G_2$ outputs a parity based on the output of the horizontal parity generator HPG and the correct data from the redundant cell array RCA. The EOR gate $G_3$ outputs a parity obtained based on only the output of the vertical parity generator VPG. The comparator CMP compares these parities with the horizontal parity HP and the vertical parity generated from the parity cell array PCA. If the read memory cell $MC_{(j-1)k+i+p}$ has a soft error or a hard error caused after the determination of the defective bit line, these parities do not coincide so that the comparator CMP outputs a logic level "1". If the read memory cell $MC_{(j-1)k+i+p}$ has no error, the comparator CMP outputs a logic level "0".

The switching circuit SW selects the data from the data bus DBUS in response to the redundant switching signal RS having a logic level "1". If the comparator CMP outputs "1", the EOR gate $G_1$ inverts the data from the data bus DBUS; and if the comparator CMP outputs a logic level "0", the EOR gate $G_1$ passes the data from the data bus DBUS without inversion. As a result, regardless of whether the read memory cell $MC_{(j-1)k+i+p}$ has a soft or hard error, correct data can be read at the output $D_{out}$.

When a memory cell $MC_{(j-1+q)k+i}$, arranged on the intersection of the (j+q)-th horizontal column and the i-th vertical row, is selected, the parity checking is also possible in the same way as described above.

Figure 5:
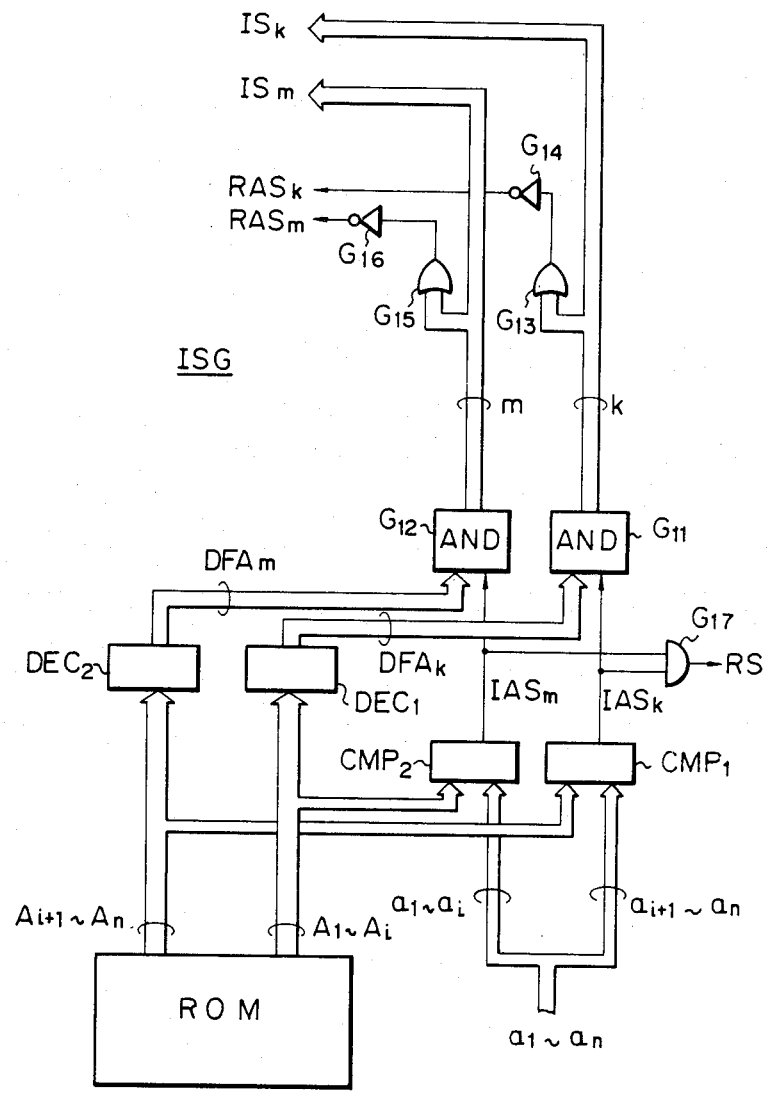
FIG. 5 is a block diagram of an inhibit control circuit in the device shown in FIG. 3.

The signals $IS_k$, $IS_m$, $RAS_k$, $RAS_m$, and RS are generated by the inhibit control circuit CTL. FIG. 5 shows a practical example of the inhibit control circuit CTL. In FIG. 5, the inhibit control circuit CTL comprises a read only memory (defective-column address memory) ROM for previously storing the address of the defective column line (defective bit line) having a hard defect (this address is referred to as a defective column address), an an inhibit signal generating circuit ISG which compares the defective column address with the external column address $a_1$ through $a_n$ for selecting a bit line BL. When there is a coincidence, the inhibit signal generating circuit ISG changes the corresponding inhibit signal IS to the H level. The inhibit signal generating circuit ISG includes two comparators $CMP_1$ and $CMP_2$, two decoders $DEC_1$ and $DEC_2$, two AND gates $G_{11}$ and $G_{12}$, two OR gates $G_{13}$ and $G_{15}$, two inverters $G_{14}$ and $G_{16}$, and an AND gate $G_{17}$.

The external addresses $a_1$ through $a_n$ for specifying a bit line are divided into two groups, i.e., $a_1$ through $a_i$, and $a_{i+1}$ through $a_n$, where $2^i = k$ and $2^{n-i} = m$. The first group of address $a_1$ through $a_i$ (referred to as a horizontal external-column address) is used for specifying the i-th vertical row from k rows in the H-V matrix shown in FIG. 2. The second group of address (referred to as a vertical external-column address) $a_{i+1}$ through $a_n$ is used for specifying the j-th column from m columns in the H-V matrix shown in FIG. 2. The horizontal-column address selected from $a_1$ through $a_i$ is input to the vertical-address comparator $CMP_2$. The vertical external-column address selected from $a_{i+1}$ through $a_n$ is input to a horizontal-address comparator $CMP_1$.

The defective-column address stored in the memory ROM is expressed by $A_1$ through $A_n$. The number of bits of the defective-column address $A_1$ through $A_n$ is, from the nature of the case, the same as the number of bits of the external column address $a_1$ through $a_n$. The defective-column address $A_1$ through $A_n$ is also divided into two groups, i.e., $A_1$ through $A_i$ and $A_{i+1}$ through $A_n$. The defective-column address selected from the group $A_1$ through $A_i$ (horizontal defective-column address is compared with the horizontal external-column address selected from the group $a_1$ through $a_i$ by the vertical-address comparator $CMP_2$. The the defective-column address (vertical defective-column address) selected from the group $A_{i+1}$ through $A_n$ is compared with the external column address selected from the group $a_{i+1}$ through $a_n$ by the horizontal-address comparator $CMP_1$. The horizontal-address comparator $CMP_1$ generates a horizontal column inhibit-activating signal $IAS_k$ having a logic level of "1" when $a_{i+1}$ through $a_n$ coincides with $A_{i+1}$ through $A_n$. The vertical-address comparator $CMP_2$ generates a vertical column inhibit-activating signal $IAS_m$ having a logic level of "1" when $a_1$ through $a_i$ coincides with $A_1$ through $A_i$.

The horizontal defective-column address $A_1$ through $A_i$ and the vertical defective-column address $A_{i+1}$ through $A_n$ are respectively transferred to a horizontal address decoder $DEC_1$ and a vertical address decoder $DEC_2$. The horizontal address decoder $DEC_1$ decodes the address $A_1$ through $A_n$ to provide a k-bit decoded signal $DFA_k$ in which only one bit is "1", which represents the position of the defective row in the H-V matrix shown in FIG. 2. The output $DFA_m$ of the vertical address decoder $DEC_2$ has m bits in which, also, only one bit becomes "1", which represents the position of the defective row in the H-V matrix. The cross point on the H-V matrix, indicated by the outputs $DFA_k$ and $DFA_m$, represents the position of the defective memory cell. For example, when the bit line $BL_{(j-1)k+i}$ is defective, and therefore, the memory cell $MC_{(j-1)k+i}$ is defective, the i-th bit in the k-bit signal $DFA_k$ becomes "1", and the j-th bit in the m-bit signal $DFA_m$ becomes "1". In this case, the i-th column and the j-th row in the H-V matrix are defective.

When the horizontal column inhibit-activating signal $IAS_k$ is applied to a horizontal-column AND gate $G_{11}$, that is, when the horizontal external-column address $a_1$ through $a_n$ coincides with the horizontal defective-column address $A_1$ through $A_n$, the decoded signal $DAF_k$ is passed through the AND gate $G_{11}$ so that, in the output signal $IS_k$ having k bits, only one bit (i-th bit) becomes "1". Also when the vertical column inhibit-activating signal $IAS_m$ is applied to a vertical-column AND gate $G_{12}$, that is, when the vertical external-column address $a_{i+1}$ through $a_n$ coincides with the vertical defective-column address $A_{i+1}$ through $A_n$, the decoded signal $DFA_m$ is passed through the AND gate $G_{12}$ so that, in the output signal $IS_m$ having m bits, only one bit (j-th bit) becomes "1". When the inhibit-activating signals $IAS_k$ and $IAS_m$ are not generated because of noncoincidence of the external address and the defective address, all bits of the signals $IS_k$ and $IS_m$ are "0". The signals $IS_k$ and $IS_m$ are applied as inhibit signals to the inhibit circuits $IC_0$ and $IC_1$ (FIG. 3), respectively.

The inhibit signals $IS_k$ and $IS_m$ are also transferred to the inputs of OR gates $G_{13}$ and $G_{15}$, respectively. When one of the k bits in the inhibit signal $IS_k$ is "1", the output of the OR gate $G_{13}$ becomes "1". Also, when one of the m bits in the inhibit signal $IS_m$ is "1", the output of the OR gate $G_{15}$ becomes "1". In the case when all bits of the inhibit signal $IS_k$ or $IS_m$ are "0", the output of the OR gate $G_{13}$ or $G_{15}$ is "0". The outputs of the OR gates $G_{13}$ and $G_{15}$ are, respectively, inverted by inverter gates $G_{14}$ and $G_{16}$ so that redundant-cell inhibit signals $RAS_k$ and $RAS_m$ are output from the inverters $G_{14}$ and $G_{16}$. The redundant-cell inhibit signals $RAS_k$ and $RAS_m$ are input to the inhibit circuits $IC_2$ and $IC_3$ (FIG. 3), respectively.

The inhibit signal IS shown in FIG. 4 is one of the k-bits of the inhibit signal $IS_k$, one of the m-bits of the inhibit signal $IS_m$, the redundant-cell inhibit signal $RAS_k$, or the redundant-cell inhibit signal $RAS_m$.

The redundant switching signal RS is generated when both of the inhibit-activating signals $IAS_k$ and $IAS_m$ become "1", that is, when the external address $a_1$ through $a_n$ coincides with the defective column address $A_1$ through $A_n$. In response to the signal RS, the switching circuit SW (FIG. 3) selects from the redundant cell array RCA the correct data to be transferred to the EOR gate $G_1$.

As is apparent from the foregoing description, according to the first embodiment, parity checking can be carried out and correct data can be read not only when the redundant memory cell is accessed in place of the previously determined defective memory cell, but also when another memory cell is accessed which may have a soft or a hard error produced after the determination of the defective bit line.

Figure 6:
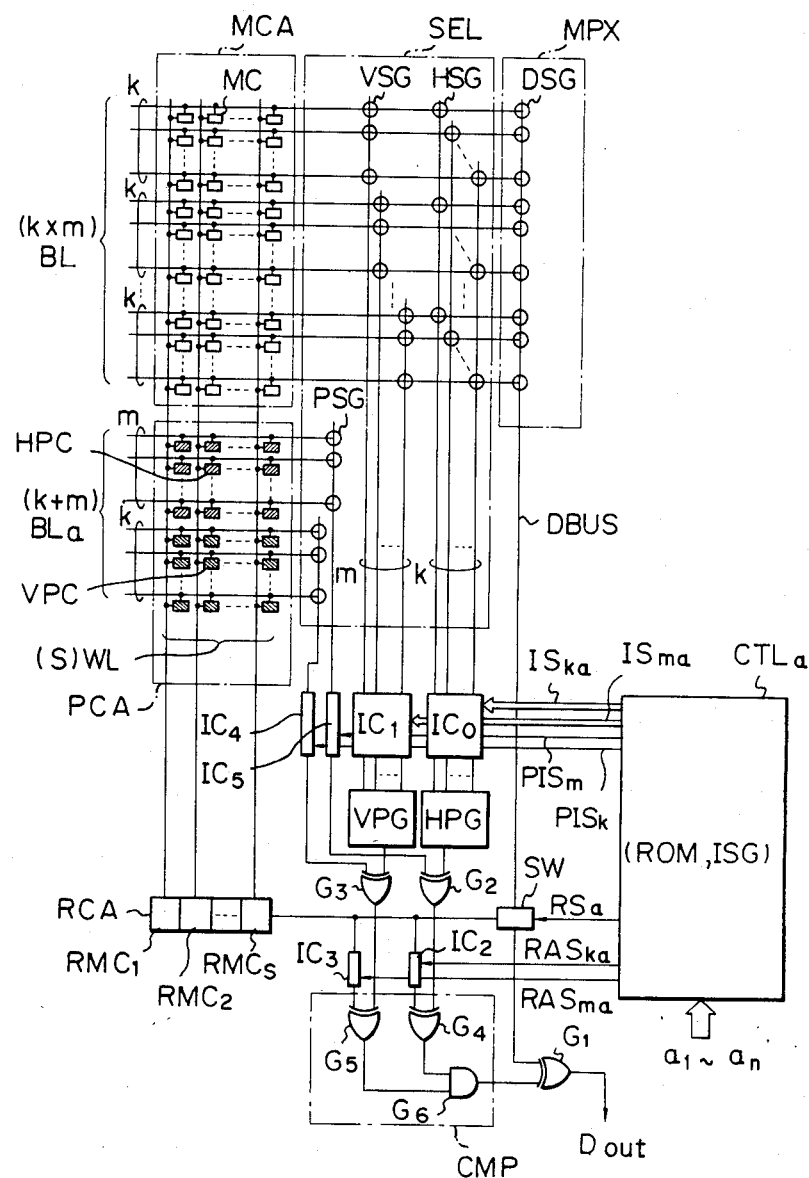
FIG. 6 is a circuit diagram of a semiconductor memory device according to another embodiment of the present invention.

FIG. 6 is a circuit diagram of another embodiment of the present invention in which a hard error in the parity cell array PCA can be remedied. In the first embodiment shown in FIG. 3, the case where a memory cell MC is replaced by a redundant memory cell RMC was shown. In the second embodiment shown in FIG. 6, this concept is further expanded so that not only a defective memory cell MC but also a defective parity cell connected to the same defective bit line can be replaced by the redundant memory cell. Particularly, an inhibit circuit $IC_4$ for the horizontal parity cells HPC and an inhibit circuit $IC_5$ for the vertical parity cells VPC are added. The outputs from the parity cells APC and VPC, and the outputs of the parity generators HPG and VPG are, at first, input to the EOR gates $G_2$ and $G_3$. The additional inhibit circuits $IC_4$ and $IC_5$ are controlled by additional parity inhibit signals $PIS_m$ and $PIS_k$, respectively. The outputs of the EOR gates $G_2$ and $G_3$ are connected to one of the inputs of the EOR gates $G_4$ and $G_5$, respectively. The output of the redundant cell array RCA is connected, through the inhibit circuit $IC_2$, to another input of the EOR gate $G_4$, and, through the inhibit circuit $IC_3$, to another input of the EOR gate $G_5$.

A modified inhibit control circuit $CTL_a$ generates the inhibit signals $PIS_m$ and $PIS_k$, as well as inhibit signals $IS_{ka}$ and $IS_{ma}$, and a redundant parity cell switching signal $RS_a$, which are similar to the inhibit signals $IS_k$ and $IS_m$, and the redundant switching signal RS shown in FIG. 3.

Figure 7:
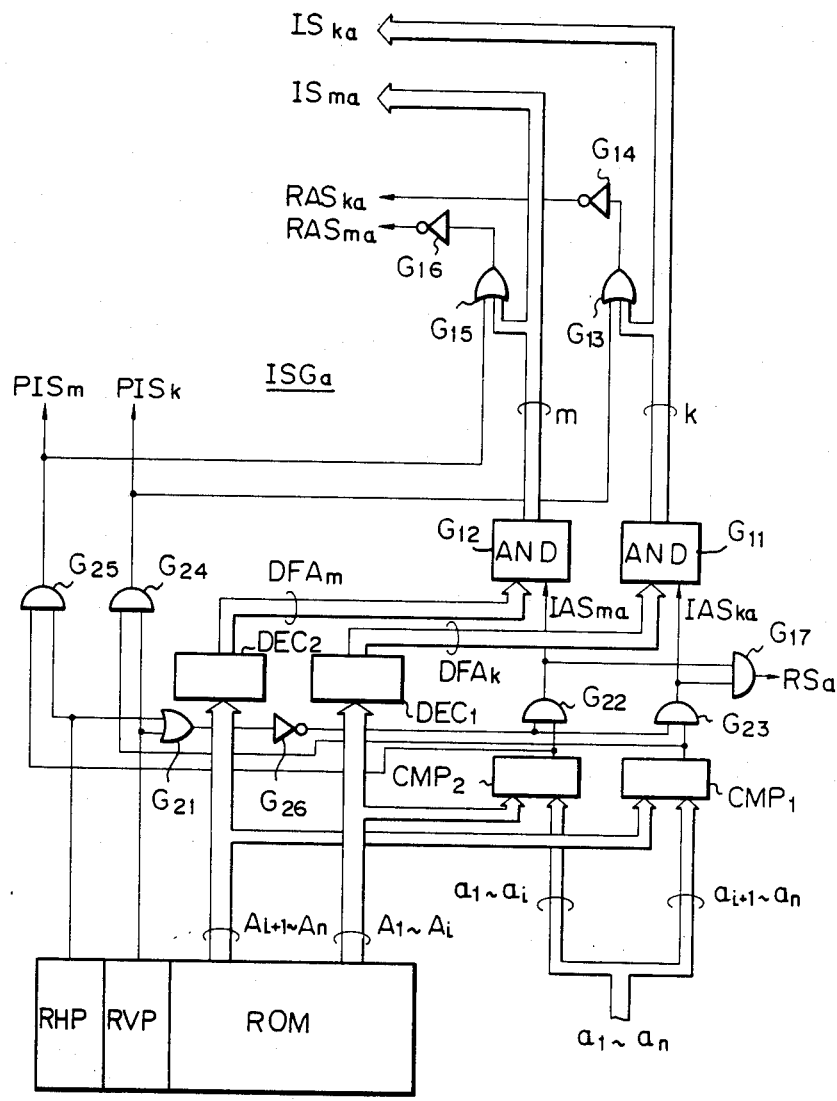
FIG. 7 is a circuit diagram of an inhibit control circuit in the device shown in FIG. 6.

FIG. 7 is a circuit diagram of an example of the modified inhibit control circuit $CTL_a$. In FIG. 7, in addition to the elements in the inhibit control circuit shown in FIG. 5, an OR gate $G_{21}$, an inverter gate $G_{26}$, and AND gates $G_{22}$ through $G_{25}$ are provided. The ROM stores, in addition to the defective column address $A_1$ through $A_n$ of the defective bit line of the defective memory cells, data RVP and RHP. When the data RHP or RVP is a logic level "1", the parity cells arranged on the defective address $A_1$ through $A_i$ or $A_{i+1}$ through $A_n$ are defective, respectively.

In this embodiment, the parity inhibit signal $PIS_k$ is generated when both conditions, i.e., when the vertical external-column address $a_{i+1}$ through $a_n$ coincides with the vertical defective-column address $A_{i+1}$ through $A_n$ and when the data RVP is "1" expressing that the vertical parity cells VPC are defective, are satisfied; and the parity inhibit signal $PIS_m$ is generated when the horizontal external-column address $a_1$ through $a_i$ coincides with the horizontal defective-column address $A_1$ through $A_i$ and when the data RHP is a logic level "1" expressing that the horizontal parity cells VHC are defective. The modified inhibit-activating signal $IAS_{ka}$ having a logic level "1" is generated for both conditions when the parity cells are not defective (RHP="0" and RVP="0") and when the external address $a_{i+1}$ through $a_n$ coincides with the defective address $A_{i+1}$ through $A_n$. The modified inhibit-activating signal $IAS_{ma}$ having a logic level "1" is generated for both conditions when the data RHP and RVP are "0" and when the external address $a_1$ through $a_i$ coincides with the defective address $A_1$ through $A_i$. The AND gate $G_{11}$ passes the decoded output $DFA_k$ which becomes the modified inhibit signal $IS_{ka}$ in response to the inhibit-activating signal $IAS_{ka}$ having a logic level "1", and the AND gate $G_{12}$ passes the decoded output $DFA_m$ which becomes the modified inhibit signal $IS_{ma}$ in response to the inhibit-activating signal $IAS_{ma}$ having a logic level "1". The modified inhibit signal $RAS_{ka}$ is "1" when all of the bits in the signal $IS_{ka}$ and the parity inhibit signal $PIS_k$ are "0"; and the signal $RAS_{ka}$ is "0" when at least one of the bits in the signals $IS_{ka}$ and $PIS_k$ is "1". The modified inhibit signal $RAS_{ma}$ is "1" when all of the bits in the signal $IS_{ma}$ and the signal $PIS_m$ are "0"; and the $RAS_{ma}$ is "0" when at least one of the bits in the signals IS and $PIS_m$ is "1". The redundant parity cell switching signal $SW_a$ is generated when both data RHP and RVP are "0" and when the external address $a_1$ through $a_n$ coincides with the defective address $A_1$ through $A_n$.

Referring to FIG. 6, the operation of the semiconductor memory device according to the second embodiment is described as follows.

When the parity cell array PCA does not include a hard error, the data RHP and RVP (FIG. 7) are "0", and thus, the parity inhibit signals $PIS_k$ and $PIS_m$ are "0". Therefore, the inhibit circuits $IC_4$ and $IC_5$ pass the horizontal parity and the vertical parity therethrough.

In this state when the external address $a_1$ through $a_n$ does not coincide with the defective address $A_1$ through $A_n$, the comparators $CMP_1$ and $CMP_2$ output "0". Thus, the inhibit-activating signals $IAS_{ka}$ and $IAS_{ma}$ are "0", fixing all bits in the inhibit signals $IS_{ka}$ and $IS_{ma}$ at the logic level "0", and fixing the redundant address signals $RAS_{ka}$ and $RAS_{ma}$ at the logic level "1" (see FIG. 7). As a result, the outputs of the inhibit circuits $IC_2$ and $IC_3$ are fixed at "0" in response to the logic level "0" of the signals $RAS_{ka}$ and $RAS_{ma}$. Accordingly, the EOR gates $G_4$ and $G_5$ pass the horizontal parity and the vertical parity without inverting the inputs of the AND gate $G_6$. The switch circuit SW selects the data bis DBUS in response to the redundant selecting signal $RS_a$, which is "0", because the comparators $CMP_1$ and $CMP_2$ output "0".

When the external address $a_1$ through $a_n$ coincides with the defective address $A_1$ through $A_n$, the comparators $CMP_1$ and $CMP_2$ a logic level output "1". The data RVP and RHP having a logic level "0" are inverted by the inverter gate $G_{26}$. Therefore, the AND gates $G_{22}$ and $G_{23}$ output a logic level "1". As a result, the signal $DFA_k$ is passed through the AND gate $G_{11}$ and becomes the signal $IS_{ka}$, and the signal $DFA_m$ is passed through the AND gate $G_{12}$ and becomes the signal $IS_{ma}$. The signals $RAS_{ka}$ and $RAS_{ma}$ are "1" because the signals $IS_{ka}$ and $IS_{ma}$, respectively, include at least one bit having a logic level of "1"; the signal $RS_a$ becomes "1", and the signals $PIS_k$ and $PIS_m$ are "0" (see FIG. 7). Thus, the correct data from the data bus DBUS can be read at the output $D_{out}$ in a manner similar to the first embodiment.

Contrary to this, when the parity cell array PCA has a hard defect, the redundant cell array RCA is used in place of the parity cell array PCA. When the defective bit is read from the parity cell array PCA, the fixed logic level "0" is output from the inhibit circuit $IC_4$ or $IC_5$ in response to "1" of the parity inhibit signal $PIS_k$ or $PIS_m$. The inhibit circuit $IC_2$ or $IC_3$ is made inoperative in response to the logic level "0" of the redundant address signal $RAS_{ka}$ or $RAS_{ma}$, enabling the use of the output of the redundant cell array RCA as the partity data. That is, when the external address $a_1$ through $a_n$ coincides with the defective address $A_1$ through $A_n$, and when the RVP or RHP is "1", the AND gate $G_{22}$ or $G_{23}$ outputs "0" because the output of the inverter gate $G_{26}$ is "0". Therefore, the signals $IS_{ka}$ and $IS_{ma}$ are "0", the signal $RS_a$ is "0", the signals $PIS_k$ and $PIS_m$ are "1", and the signals $RAS_{ka}$ and $RAS_{ma}$ are "0" (see FIG. 7).

From the foregoing description, it will be apparent that, according to the present invention, in a semiconductor memory device having a function of parity checking by employing an H–V matrix. That is, since previously determined hard defects can be replaced by redundant memory cells, the parity checking function can be advantageously used for a soft error or a hard error occurring after the determination of the previously determined hard defects.

Further, the yield of the semiconductor memory device having a function of parity checking by employing H–V matrix can be improved by employing a redundant memory cell array. Still further, the redundant technique and the parity checking technique using an H–V matrix can be combined by adding a relatively simple circuit.

What is claimed is:

1. A semiconductor memory device comprising:
   a memory cell array including a plurality of memory cells arranged in a matrix having vertical and horizontal rows and having read data stored therein;
   a redundant memory cell, operatively connected to said memory cell array, for replacing a defective one of said memory cells;
   an inhibit and parity generating circuit generating output signals; and
   an error correcting circuit including:
   a data selector, operatively connected to said memory cell array, for receiving read data from said plurality of memory cells including a selected one of said memory cells, and for selectively outputting a part of said read data which forms horizontal and vertical parity checking groups;
   a vertical parity generator and a horizontal parity generator, operatively connected to said data selector, for generating a vertical parity and a horizontal parity of said read data;
   a parity storing memory, operatively connected to said memory cell array, for storing a previously determined vertical parity and a previously determined horizontal parity; and
   a comparator, operatively connected to said vertical and horizontal parity generators and to said parity storing memory, for comparing the output signals of said inhibit and parity generating circuit with said previously determined vertical and horizontal parities so as to correct an error in said read data;

said inhibit and parity generating circuit including:

an inhibit circuit, operatively connected between said data selector and said vertical and horizontal parity generators, for selectively inhibiting data, including an error data read from a defective one of said memory cells, from entering said vertical or horizontal parity generators when said read data, from which said vertical parity and said horizontal parity are to be taken, includes said error data; and a redundant-cell parity generating circuit, operatively connected to said redundant memory cell and to said vertical and horizontal parity generators, for generating a redundant vertical parity or a redundant horizontal parity, based on data not inhibited by said inhibit circuit and the data from said redundant memory cell, when said inhibit circuit carries out an inhibit operation.

2. A semiconductor memory device as set forth in claim 1, wherein said inhibit and parity generating circuit further comprises an inhibit control circuit, operatively connected to receive an external address signal for selecting a memory cell in said memory cell array, and operatively connected to said inhibit circuit and said redundant-cell parity generating circuit, for generating inhibit signals to be input to said inhibit circuit, whereby said inhibit circuit carries out an inhibit operation in accordance with said inhibit signals.

3. A semiconductor memory device as set forth in claim 2, wherein said data selector comprises:

a vertical select gate, operatively connected between said memory cell array and said vertical parity generator, for selecting m-bit data on a selected vertical row from selected k×m bits input from said memory cell array to said data selector; and a horizontal select gate, operatively connected between said memory cell array and said horizontal parity generator, for selecting k-bit data on the horizontal row from said selected k×m bits.

4. A semiconductor memory device as set forth in claim 3, wherein said inhibit circuit comprises:

a first inhibit circuit, operatively connected between said horizontal select gate and said horizontal parity generator, for inhibiting one of said k-bits from being output from said horizontal select gate and input to said horizontal parity generator in response to a first one of said inhibit signals, said first one of said inhibit signals being generated in said inhibit control circuit when said defective memory cell is accessed; and a second inhibit circuit, operatively connected between said vertical select gate and said vertical parity generator, for inhibiting one of said m bits from being output from said vertical select gate and input to said vertical parity generator in response to a second one of said inhibit signals, said second one of said inhibit signals being generated when said defective memory cell is accessed.

5. A semiconductor memory device as set forth in claim 4, wherein said redundant-cell parity generating circuit comprises:

a third inhibit circuit, operatively connected to said redundant memory cell, for inhibiting data read from said redundant memory cell from being output in response to a third one of said inhibit signals, said third one of said inhibit signals being generated when said defective memory cell is not accessed;

a fourth inhibit circuit, operatively connected to said redundant memory cell, for inhibiting data read from said redundant memory cell from being output in response to a fourth one of said inhibit signals, said fourth one of said inhibit signals being generated when said defective memory cell is not accessed;

a first redundant parity gate having input terminals operatively connected to the outputs of said horizontal parity generator and said third inhibit circuit and having an output terminal, for generating said redundant horizontal parity; and a second redundant parity gate having input terminals operatively connected to said vertical parity generator and said redundant memory cell and having an output terminal, for generating said redundant vertical parity.

6. A semiconductor memory device as set forth in claim 5, wherein said comparator comprises:

a horizontal parity gate, having input terminals operatively connected to the output terminal of said first redundant parity gate and to said parity storing memory and having an output terminal outputting signals, for effecting a horizontal parity processing based on said redundant horizontal parity and said previously determined horizontal parity;

a vertical parity gate, having input terminals operatively connected to the output terminal of said second redundant parity gate and to said parity storing memory having an output terminal outputting signals, for effecting a vertical parity processing based on said redundant vertical parity and said previously determined vertical parity; and an AND gate having input terminals operatively connected to the output terminal of said horizontal parity gate and the output terminal of said vertical parity gate, for providing a coincidence signal when said output signals at said output terminals of said horizontal parity gate and said vertical parity gate coincide.

7. A semiconductor memory device as set forth in claim 6, further comprising a data correcting gate for correcting said read data when said coincidence signal is generated from said AND gate.

8. A semiconductor memory device as set forth in claim 7, wherein said inhibit control circuit comprises:

a defective-column address memory having a storing area for storing the defective column address of said defective memory cell; and an inhibit-signal generating circuit, operatively connected to receive said defective column address of said defective memory cell and an external column address signal, for specifying a memory cell and for providing said inhibit signals when said defective column address coincides with said external column address signal.

9. A semiconductor memory device as set forth in claim 8, wherein said inhibit-signal generating circuit comprises:

a horizontal address decoder, operatively connected to receive a first part of said defective column address from said defective-column address memory, for providing k bits of a decoded output signal;

a vertical address decoder, operatively connected to receive a second part of said defective column address from said defective-column address memory, for providing m bits of a decoded output signal;

a first comparator, operatively connected to receive said second part of said defective column address, for comparing said second part of said defective column address with a corresponding second part of said external column address;

a second comparator, operatively connected to receive said first part of said defective column address, for comparing said first part of said defective column address with a corresponding first part of said external column address;

a first AND gate, operatively connected to said horizontal address decoder, for outputting said k-bits of said decoded output signal from said horizontal address decoder only when said first comparator generates a coincidence signal, one of said k-bits being said first inhibit signal;

a second AND gate, operatively connected to said vertical address decoder, for outputting said m-bits of said decoded output signal from said vertical address decoder only when said second comparator generates a coincidence signal, one of said m-bits being said second inhibit signal;

a first inverter gate, operatively connected to said first AND gate, for inverting said first inhibit signal so as to provide said third inhibit signal; and a second inverter gate, operatively connected to said second AND gate, for inverting said second inhibit signal so as to provide said fourth inhibit signal.

10. A semiconductor memory device as set forth in claim 4, wherein said redundant-cell-parity generating circuit comprises:

a third inhibit circuit, operatively connected to said parity storing memory, for inhibiting data read out from said parity storing memory from being output by generating a third inhibit signal, said third inhibit signal being generated when said previously determined horizontal parity has a hard error;

a fourth inhibit circuit, operatively connected to said parity storing memory, for inhibiting data read from said parity storing memory from being output by generating a fourth inhibit signal, said fourth inhibit signal being generated when said previously determined vertical parity has a hard error;

a first parity gate having input terminals operatively connected to the output terminal of said horizontal parity generator and said third inhibit circuit, for generating a horizontal parity;

a second parity gate having input terminals operatively connected to the output terminal of said vertical parity generator and said fourth inhibit circuit, for generating a vertical parity;

a fifth inhibit circuit, operatively connected to said redundant memory cell, for inhibiting data read out from said redundant memory cell from being output in response to a fifth one of said inhibit signals, said fifth one of said inhibit signals being generated when said defective memory cell is not accessed and said previously determined vertical parity has a hard error;

a sixth inhibit circuit, operatively connected to said redundant memory cell, for inhibiting data read out from said redundant memory cell from being output in response to a sixth one of said inhibit signals, said sixth one of said inhibit signals being generated when said defective memory cell is not accessed and said previously determined horizontal parity has a hard error;

a horizontal parity gate, having input terminals operatively connected to the output terminal of said first parity gate and to said fifth inhibit circuit, for outputting signals and for effecting a horizontal parity processing;

a vertical parity gate, having input terminals operatively connected to the output terminal of said second parity gate and said sixth inhibit circuit, for outputting signals and for effecting a vertical parity processing; and an AND gate having input terminals operatively connected to said horizontal parity gate and said vertical parity gate, for outputting a coincidence signal when said output signals of said horizontal parity gate and said vertical parity gate coincide.

11. A semiconductor memory device as set forth in claim 10, further comprising a data correcting gate, operatively connected to said AND gate, for correcting said read data when said coincidence signal is output from said AND gate.

12. A semiconductor memory device as set forth in claim 11, wherein said inhibit control circuit comprises:

a defective-column address memory having a first storing area for storing the defective column address of said defective memory cell and a second storing area for storing parity data indicating whether said previously determined vertical or horizontal parity has a hard error;

an inhibit-signal generating circuit, operatively connected to receive said defective column address of said defective memory cell, said parity data, and an external column address signal for specifying a memory cell, for providing said inhibit signals when said defective column address coincides with said external column address and when said parity data indicates that said previously determined vertical or horizontal parity does not have a hard error.

13. A semiconductor memory device as set forth in claim 12, wherein said inhibit-signal generating circuit comprises:

a horizontal address decoder, operatively connected to receive a part of said defective column address from said first defective-column address memory, for providing k-bits of a decoded output signal;

a vertical address decoder, operatively connected to a receive a second part of said defective column address from said defective-column address memory, for providing m-bits of the decoded output signal;

a first comparator for comparing said second part of said defective column address with a corresponding part of said external column address;

a second comparator for comparing said first part of said defective column address with a corresponding part of said external column address;

a first AND gate for outputting said k-bits of the decoded output signals from said horizontal address decoder when both said first comparator generates a coincidence signal and said parity data indicates a hard error in the previously determined parity, one of said k-bits output by said first AND gate being said first inhibit signal;

a second AND gate, operatively connected to said vertical address decoder, for passing said m-bits of the decoded output signals from said vertical address decoder when both said second comparator generates a coincidence signal and said parity data expresses a hard error in the previously determined parity, one of said m-bits output by said second AND gate being said second inhibit signal;
a first inverter gate, operatively connected to said first AND gate, for inverting a logic OR of said fourth inhibit signal and said first inhibit signal so as to provide said sixth inhibit signal; and
a second inverter gate, operatively connected to said second AND gate, for inverting a logic OR of said third inhibit signal and said second inhibit signal so as to provide said fifth inhibit signal.

14. A semiconductor memory device comprising:
a memory cell array including memory cells for storing read data, the read data containing error data;
a parity cell array, operatively connected to said memory cell array, for storing a correct vertical parity and a correct horizontal parity;
a redundant cell array, operatively connected to said parity cell array, including redundant memory cells for replacing a defective one of said memory cells in said memory cell array;
inhibit circuits, operatively connected to said redundant cell array, for inhibiting the error data from being output;
a vertical parity generator, operatively connected to said inhibit circuits, for generating vertical parity signals of the read data;
a horizontal parity generator, operatively connected to said inhibit circuits, for generating horizontal parity signals of the read data;
an inhibit control circuit, operatively connected to said inhibit circuits, for controlling said inhibit circuits and for providing a redundant switching signal; and
a comparator, operatively connected to said vertical parity generator, said horizontal parity generator and said parity cell array, for comparing said redundant switching signal with said correct vertical and horizontal parities so as to correct the error in the read data.

* * * * *

UNITED STATES PATENT AND TRADEMARK OFFICE
CERTIFICATE OF CORRECTION

PATENT NO. : 4,688,219

DATED : AUGUST 18, 1987

INVENTOR(S) : YOSHIHIRO TAKEMAE

It is certified that error appears in the above-identified patent and that said Letters Patent is hereby corrected as shown below:

Col. 2, line 6, "m emory" should be --memory--;
      line 24, "two-demensional" should be --two-dimensional--.

Col. 3, line 1, delete "of a";
      line 26, "$DGS_s$" should be --DGSs--.

Col. 4, line 55, "redundance" should be --redundancy--.

Col. 6, line 49, "inbit" should be --inhibit--.

Col. 8, line 50, "address" should be --addresses--.

Col. 9, line 2, "dress" should be --dress)--;
      line 4, delete "the" (second occurrence).

Col. 10, line 35, "APC" should be --HPC--.

UNITED STATES PATENT AND TRADEMARK OFFICE
CERTIFICATE OF CORRECTION

PATENT NO. : 4,688,219

DATED : AUGUST 18, 1987

INVENTOR(S) : YOSHIHIRO TAKEMAE

It is certified that error appears in the above-identified patent and that said Letters Patent is hereby corrected as shown below:

Col. 11, line 54, "bis" should be --bus--;
     line 60, "a logic level output" should be --output a logic level--.

Col. 12, line 1, delete ";";
     line 11, after "to" insert --the logic level--.

Signed and Sealed this

Twelfth Day of January, 1988

Attest:

DONALD J. QUIGG

Attesting Officer

Commissioner of Patents and Trademarks